(12) United States Patent
Yu

(10) Patent No.: US 9,955,537 B2
(45) Date of Patent: *Apr. 24, 2018

(54) BIDIRECTIONAL LED LIGHT STRING

(71) Applicant: 1 ENERGY SOLUTIONS, INC., Agoura Hills, CA (US)

(72) Inventor: Jing Jing Yu, El Monte, CA (US)

(73) Assignee: 1 ENERGY SOLUTIONS, INC., Agoura Hills, CA (US)

(\*) Notice: Subject to any disclaimer, the term of this patent is extended or adjusted under 35 U.S.C. 154(b) by 0 days.

This patent is subject to a terminal disclaimer.

(21) Appl. No.: 15/615,657

(22) Filed: Jun. 6, 2017

(65) Prior Publication Data

US 2018/0007748 A1  Jan. 4, 2018

Related U.S. Application Data

(63) Continuation of application No. 15/047,518, filed on Feb. 18, 2016, now Pat. No. 9,713,205.

(Continued)

(51) Int. Cl.
*H05B 37/00* (2006.01)
*H05B 33/08* (2006.01)
(Continued)

(52) U.S. Cl.
CPC ..... *H05B 33/0803* (2013.01); *F21V 19/0015* (2013.01); *F21V 23/04* (2013.01);
(Continued)

(58) Field of Classification Search
CPC ............ H05B 33/0803; H05B 33/0809; H05B 33/0821; H05B 33/0824; H05B 37/036; H05B 39/105; F21V 23/04
(Continued)

(56) References Cited

U.S. PATENT DOCUMENTS 1,656,148 A  4/1926 Harris
1,677,972 A  7/1928 Marks
(Continued)

FOREIGN PATENT DOCUMENTS

CN  2292482  4/1997
CN  2643777  8/2003
(Continued)

OTHER PUBLICATIONS

Artificial Christmas Tree Assembly, Use & Care Instructions, Balsam Hill; https://web.archive.org/web/20100706111614/http://www.balsamhill.com/ARticles.asp?ID . . . printed Jan. 24, 2014.

*Primary Examiner* — Tung X Le
(74) *Attorney, Agent, or Firm* — William W. Cochran; Cochran Freund & Young LLC

(57) ABSTRACT

Disclosed is a rectifierless light string that uses bidirectional LEDs. Each LED is illuminated on both the positive and the negative portion of an AC signal so that the AC signal does not have to be rectified. In addition, LEDs are mounted on LED holder plugs, which are designed to allow the LEDs and bypass resistors to be automatically inserted in the LED holder plug. The LED holder plugs are inserted into a light string socket that contains a shunt switch that provides a conduction path when the LED holder plug is not firmly inserted in the light string socket. In this manner, conduction can occur in the light string when the LED holder plug is dislodged.

4 Claims, 9 Drawing Sheets

Related U.S. Application Data

(60) Provisional application No. 62/251,586, filed on Nov. 5, 2015, provisional application No. 62/135,078, filed on Mar. 18, 2015, provisional application No. 62/117,790, filed on Feb. 18, 2015.

(51) Int. Cl.

| | | |
|---|---|---|
| *F21V 19/00* | (2006.01) | |
| *F21V 23/04* | (2006.01) | |
| *F21S 4/10* | (2016.01) | |
| *F21W 121/00* | (2006.01) | |
| *F21Y 115/10* | (2016.01) | |
| *H01R 33/09* | (2006.01) | |

(52) U.S. Cl.
CPC ............ *H05B 33/0824* (2013.01); *F21S 4/10* (2016.01); *F21W 2121/00* (2013.01); *F21Y 2115/10* (2016.08); *H01R 33/09* (2013.01)

(58) Field of Classification Search
USPC ................................ 315/185 R, 193; 362/231
See application file for complete search history.

(56) References Cited

U.S. PATENT DOCUMENTS

| | | |
|---|---|---|
| 2,214,046 A | 12/1938 | Doran |
| 2,188,529 A | 1/1940 | Corina |
| 2,857,506 A | 10/1958 | Minteer |
| 3,206,593 A | 3/1962 | Winnicki, Sr. |
| 3,603,780 A | 9/1971 | Lu |
| 3,970,834 A | 7/1976 | Smith |
| 3,985,924 A | 10/1976 | Pritza |
| 4,020,201 A | 4/1977 | Miller |
| 4,060,722 A | 11/1977 | Foley |
| 4,068,118 A | 1/1978 | Carrington |
| 4,364,102 A | 12/1982 | Huppert et al. |
| 4,573,102 A | 2/1986 | Norwood |
| 5,517,390 A | 5/1996 | Zins |
| 5,609,412 A | 3/1997 | Contigiani |
| 5,855,705 A | 1/1999 | Gauthier |
| 6,017,142 A | 1/2000 | Harris, Jr. |
| 6,228,442 B1 | 5/2001 | Coco |
| 6,942,355 B1 | 9/2005 | Castiglia |
| 6,951,405 B2 | 11/2005 | Yao |
| 7,052,156 B2 | 5/2006 | Primeau |
| 7,055,981 B2 | 6/2006 | Yao |
| 7,132,139 B2 | 11/2006 | Yang |
| 7,445,824 B2 | 11/2008 | Leung et al. |
| 7,896,516 B1 | 3/2011 | Zhu |
| 8,298,633 B1 | 10/2012 | Chen |
| 8,454,186 B2 | 6/2013 | Chen |
| 8,454,187 B2 | 6/2013 | Chen |
| D686,523 S | 7/2013 | Chen |
| 8,568,015 B2 | 10/2013 | Chen |
| D696,153 S | 12/2013 | Chen |
| 9,829,162 B2 * | 11/2017 | Han .......................... F21S 4/10 |
| 2005/0180163 A1 | 8/2005 | Huang |
| 2006/0044822 A1 | 3/2006 | Katsumata |
| 2006/0164834 A1 | 7/2006 | Kao |
| 2007/0092664 A1 | 4/2007 | Chun |
| 2007/0177402 A1 | 8/2007 | Wu |
| 2007/0253191 A1 | 11/2007 | Chin et al. |
| 2008/0211415 A1* | 9/2008 | Altamura ............. H05B 37/036 315/192 |
| 2009/0029075 A1 | 1/2009 | Barthelmess |
| 2009/0080185 A1 | 3/2009 | McMillan |
| 2009/0128042 A1* | 5/2009 | Janning ................ H05B 37/036 315/122 |
| 2010/0072747 A1 | 3/2010 | Krize |
| 2011/0068701 A1* | 3/2011 | van de Ven .......... H05B 33/083 315/185 R |
| 2012/0076957 A1 | 3/2012 | Chen |
| 2013/0059094 A1 | 3/2013 | Chen |
| 2013/0108808 A1 | 5/2013 | Leung et al. |
| 2013/0120971 A1 | 5/2013 | Chen |
| 2013/0163231 A1 | 6/2013 | Chen |
| 2013/0301245 A1 | 11/2013 | Chen |
| 2013/0301246 A1 | 11/2013 | Chen |
| 2013/0301247 A1 | 11/2013 | Chen |
| 2013/0308301 A1 | 11/2013 | Chen |
| 2014/0026483 A1 | 2/2014 | Chen |

FOREIGN PATENT DOCUMENTS

| | | |
|---|---|---|
| CN | 2812761 | 9/2004 |
| CN | 2751226 | 11/2004 |
| CN | 2769694 | 11/2004 |
| CN | 201318583 | 11/2008 |
| DE | 8436328 | 4/1985 |
| DE | 10235081 | 8/2002 |
| EP | 1887280 | 8/2006 |
| GB | 1490174 | 12/1975 |
| GB | 2112281 | 10/1981 |
| GB | 2137086 | 2/1983 |
| GB | 2161595 | 7/1984 |
| GB | 2172135 | 3/1986 |
| GB | 2382772 | 12/2001 |
| GB | 2471475 | 6/2009 |
| GB | 2496290 | 10/2012 |
| NL | 9400893 | 1/1994 |
| WO | 9626661 | 9/1996 |
| WO | 2010057426 | 5/2010 |

* cited by examiner

BIDIRECTIONAL LED LIGHT STRING

BACKGROUND

Light emitting diodes (LEDs) have played an important role in the lighting industry. LEDs use considerably less energy than incandescent bulbs. Further, LEDs are less expensive to manufacture. LEDs also have a long lifetime, which reduces the necessity and expense of changing bulbs. In typical use situations, an LED may have a lifetime of 50,000 hours, whereas an incandescent bulb may have a lifetime of 1,000 to 2,000 hours. Accordingly, the convenience of using LED bulbs is great, as well as the cost savings involved with the use of LED bulbs.

SUMMARY

An embodiment of the present invention may therefore comprise serial light emitting diode light string that does not use a rectifier comprising: a plurality of bidirectional light emitting diodes, each of the plurality of bidirectional light emitting diodes comprising: a first light emitting diode mounted on a first wafer that is encapsulated by a lens, the first light emitting diode having an anode and a cathode; a second light emitting diode mounted on a second wafer that is encapsulated by the lens, the second light emitting diode having an anode that is electrically connected to the cathode of the first light emitting diode to form a first node and a cathode that is electrically connected to the anode of the first light emitting diode to form a second node; a serial string of the plurality of bidirectional light emitting diodes formed by connecting the first nodes of each of the plurality of light emitting diodes to the second node of another of the plurality of bidirectional light emitting diodes; an alternating current connector attached to the serial string of bidirectional light emitting diodes to form the light emitting diode light string, the alternating current connector providing alternating current to the serial string of bidirectional light emitting diodes, without a rectifier, which causes the first light emitting diode to be illuminated while the alternating current is positive, and which causes the second light emitting diode to be illuminated while the alternating current is negative, so that the bidirectional light emitting diodes do not flicker and have an extended life, since each of the first light emitting diode and the second light emitting diode is illuminated for a half of a cycle of the alternating current.

An embodiment of the present invention may further comprise light emitting diode connector assembly comprising: a light string socket having a central cavity; wire lead connectors attached to the light string socket that attach to light string wires of a light string; a light emitting diode plug that has a size and shape to fit firmly in the central cavity of the light string socket, the light emitting diode plug having a central cavity and constructed to allow leads of a resistive circuit component and leads of a light emitting diode to be inserted through the light emitting diode plug and wrapped around an exterior portion of the light emitting diode plug; light string contacts disposed in the central cavity of the light string socket on an inner surface of the light string socket, which are aligned with the leads of the resistive element and the leads of the light emitting diode, that are wrapped around an outer surface of the light string socket, so that the leads of the resistive element and the leads of the light emitting diode electrically connect to the light string contacts when the light emitting diode holder plug is inserted in the light string socket; a shunt switch that is electrically connected to the light string contacts; a switch disconnect shaft disposed on the light emitting diode holder plug that engages the shunt switch and separates spring arms of the shunt switch when the light emitting diode holder plug is fully inserted in the light string socket so that the shunt switch is open; the resistive component providing an alternative current path around the light emitting diode whenever the light emitting diode is burned out and the shunt switch providing an alternative current path in the light string socket whenever the light emitting diode holder plug is dislodged from the light string socket.

An embodiment of the present invention may further comprise a method of attaching a light emitting diode to a light string comprising: securing the light emitting diode to a light emitting diode holder plug; inserting leads of the light emitting diode in an automated fashion through a central portion of the light emitting diode holder plug and wrapping the leads of the light emitting diode around an outer surface of the light emitting diode holder plug; inserting leads of a resistive component through the light emitting diode holder plug in an automated fashion and wrapping the leads of the resistive component around an outer surface of the light emitting diode holder plug; providing a light string socket that is electrically connected to wires of the light string, the light string socket having light string contacts on an interior portion of the light string socket that are aligned with the leads of the light emitting diode and the leads of the resistive component when the light emitting diode holder plug is inserted into the light string socket so that the resistive component provides an alternative current path whenever the light emitting diode is burned out and the light emitting diode plug is inserted in the light string socket; providing a shunt switch that is electrically connected to the light string contacts and is disposed in the light string socket so that the light string contacts are electrically connected whenever the light emitting diode holder plug is dislodged from the light string socket; opening the shunt switch when the light emitting diode holder plug is inserted in the light string socket so that the shunt switch does not provide a current path for the light string when the light emitting diode holder plug is inserted in the light string socket and current flows through the light emitting diode or the resistive element.

An embodiment of the present invention may further comprise a serial light emitting diode light string that does not use a rectifier comprising: a plurality of bidirectional light emitting diodes, each of the plurality of bidirectional light emitting diodes comprising: a first light emitting diode mounted on a first wafer that is encapsulated by a lens, the first light emitting diode having an anode and a cathode; a second light emitting diode mounted on a second wafer that is encapsulated by the lens, the second light emitting diode having an anode that is electrically connected to the cathode of the first light emitting diode to form a first node and a cathode that is electrically connected to the anode of the first light emitting diode to form a second node; a serial string of the plurality of bidirectional light emitting diodes formed by connecting the first nodes of each of the plurality of light emitting diodes to the second node of another of the plurality of bidirectional light emitting diodes; an alternating current connector attached to the serial string of bidirectional light emitting diodes to form the light emitting diode light string, the alternating current connector providing alternating current to the serial string of bidirectional light emitting diodes, without a rectifier, which causes the first light emitting diode to be illuminated while the alternating current is positive, and which causes the second light emitting diode to be illuminated while the alternating current is negative, so that the bidirectional light emitting diodes do not flicker and have an extended life, since each of the first light emitting diode and the second light emitting diode is illuminated for a half of a cycle of the alternating current; a light emitting diode connector assembly for mounting and connecting the plurality of bidirectional light emitting diodes to form the serial string of the plurality of bidirectional light emitting diodes comprising: a light string socket having a central cavity; wire lead connectors attached to the light string socket that attach to light string wires of a light string; a light emitting diode plug that has a size and shape to fit firmly in the central cavity of the light string socket, the light emitting diode plug having a central cavity and constructed to allow leads of a resistive circuit component and leads of a light emitting diode to be inserted through the light emitting diode plug and wrapped around an exterior portion of the light emitting diode plug; light string contacts disposed in the central cavity of the light string socket on an inner surface of the light string socket, which are aligned with the leads of the resistive element and the leads of the light emitting diode, that are wrapped around an outer surface of the light string socket, so that the leads of the resistive element and the leads of the light emitting diode electrically connect to the light string contacts when the light emitting diode holder plug is inserted in the light string socket; a shunt switch that is electrically connected to the light string contacts; a switch disconnect shaft disposed on the light emitting diode holder plug that engages the shunt switch and separates spring arms of the shunt switch when the light emitting diode holder plug is fully inserted in the light string socket so that the shunt switch is open; the resistive component providing an alternative current path around the light emitting diode whenever the light emitting diode is burned out and the shunt switch providing an alternative current path in the light string socket whenever the light emitting diode holder plug is dislodged from the light string socket.

An embodiment of the present invention may further comprise a method of making a serial light emitting diode light string that does not use a rectifier comprising: providing a plurality of bidirectional light emitting diodes, each of the plurality of bidirectional light emitting diodes comprising: a first light emitting diode mounted on a first wafer that is encapsulated by a lens, the first light emitting diode having an anode and a cathode; a second light emitting diode mounted on a second wafer that is encapsulated by the lens, the second light emitting diode having an anode that is electrically connected to the cathode of the first light emitting diode to form a first node and a cathode that is electrically connected to the anode of the first light emitting diode to form a second node; connecting the plurality of bidirectional light emitting diodes to the serial light emitting diode light string so that the first nodes are connected to the second nodes to form a serial string of bidirectional light emitting diodes, comprising: securing the light emitting diode to a light emitting diode holder plug; inserting leads of the light emitting diode in an automated fashion through a central portion of the light emitting diode holder plug and wrapping the leads of the light emitting diode around an outer surface of the light emitting diode holder plug; inserting leads of a resistive component through the light emitting diode holder plug in an automated fashion and wrapping the leads of the resistive component around an outer surface of the light emitting diode holder plug; providing a light string socket that is electrically connected to wires of the light string, the light string socket having light string contacts on an interior portion of the light string socket that are aligned with the leads of the light emitting diode and the leads of the resistive component when the light emitting diode holder plug is inserted into the light string socket so that the resistive component provides an alternative current path whenever the light emitting diode is burned out and the light emitting diode plug is inserted in the light string socket; a shunt switch that is electrically connected to the light string contacts and is disposed in the light string socket so that the light string contacts are electrically connected whenever the light emitting diode holder plug is dislodged from the light string socket; opening the shunt switch when the light emitting diode holder plug is inserted in the light string socket so that the shunt switch does not provide a current path for the light string when the light emitting diode holder plug is inserted in the light string socket and current flows through the light emitting diode or the resistive element; applying an alternating current to the serial string of bidirectional light emitting diodes without rectifying the alternating current which causes the first light emitting diode to illuminate when the alternating current is positive, and causes the second light emitting diode to illuminate when the alternating current is negative, so that the bidirectional light emitting diodes do not flicker and have an extended life since each of the first light emitting diode and the second light emitting diode are illuminated for a half cycle of the alternating current.

DETAILED DESCRIPTION OF THE EMBODIMENTS

Figure 1:
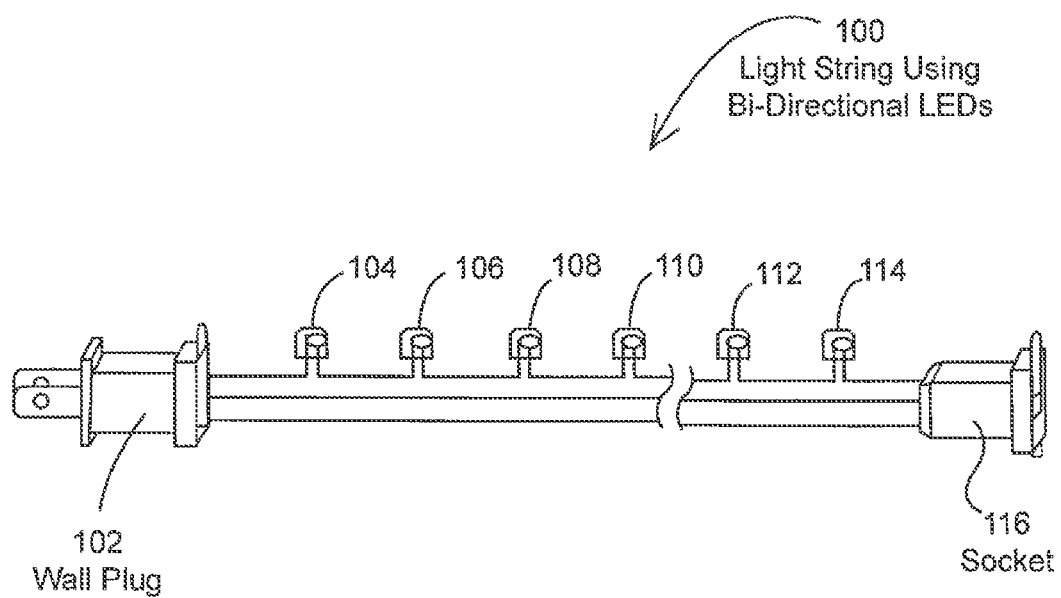
FIG. 1 is an embodiment of a bidirectional LED light string.

FIG. 1 is a pictorial circuit diagram of an embodiment of a bidirectional LED light string. As shown in FIG. 1, plug 102 is adapted to be plugged into a wall socket having an AC signal. A standard wall socket carries 117 volts RMS on a standard sinusoidal electric power signal. The circuit illustrated in FIG. 1 does not require a rectifier that rectifies the signal to create either a half wave signal or a full wave rectified signal, as explained below.

Figure 2:
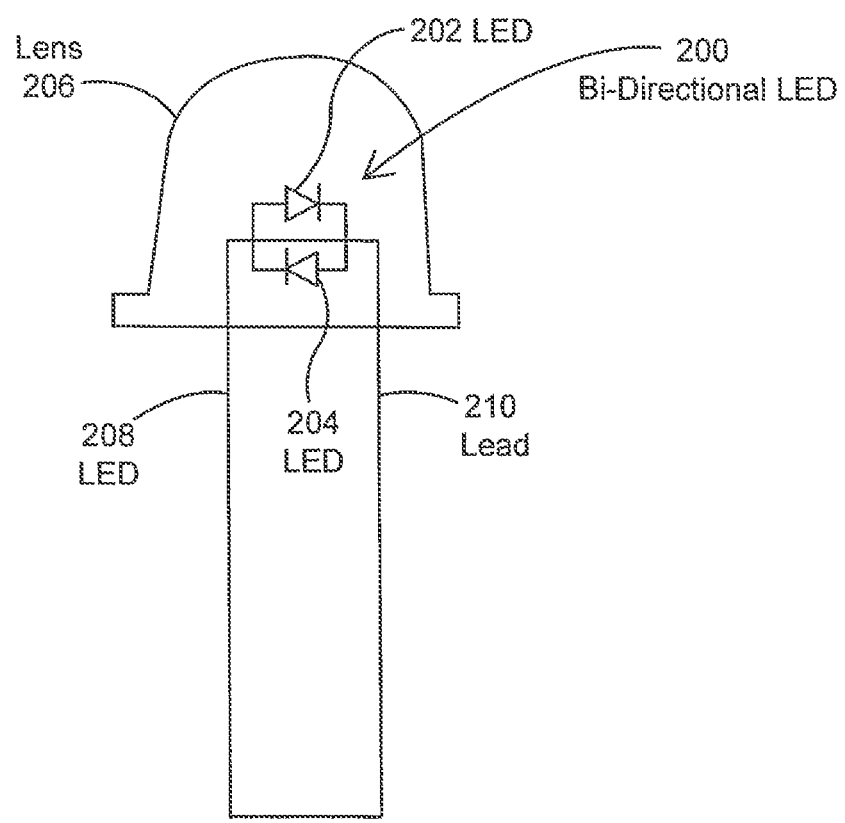
FIG. 2 is an embodiment of a bidirectional LED.

Each of the LEDs 104, 106, 108, 110, 112, 114 comprise bidirectional LEDs that are two LEDs connected in parallel in opposite polarization directions, as shown in FIG. 2, in more detail. By using bidirectional LEDs, one of the LEDs will activate during the positive portion of the sinusoidal AC signal, while the other LED will activate during the negative portion of the sinusoidal AC signal. As such, at least one of the two bidirectional LEDs is lit at substantially all times. This eliminates the flickering that can occur when an AC signal is applied to a single LED and the flickering that occurs as a result of half-wave rectification. Of course, to eliminate flickering using a standard LED, a full-wave rectifier can be used, together with other components, such as capacitors, resistors, and inductors, to provide a substantially DC signal that does not vary substantially in magnitude and does not create flickering using non-bidirectional LEDs. However, rectifiers can be expensive when compared to the other components of an LED light string and add complexity to the light string, so elimination of the rectifier makes the light strings simpler and less expensive.

Since each of the LEDs in the bidirectional LEDs 104-114 is activated during a half cycle, the light string has a lifetime that is double the lifetime of a single LED in a light string having a fully rectified sinusoidal signal because the LEDs in the bidirectional LED are illuminated for only half of a cycle. As such, rectifiers can be eliminated from the light string circuitry when bidirectional LEDs are used. Each of the LEDs in the bidirectional LED combination typically cause a voltage drop of about 2.2 volts when a 117 volt RMS AC signal is applied to the light string. The voltage drop across each of the LEDs in a string of serially connected LEDs is caused by the impedance of the LEDs when an AC signal is applied to the circuit. Impedance (Z) is the combination of the resistance (R) plus the reactance (X) of the LED. LEDs have virtually no resistance but have a reactance sufficient to cause the voltage drop of typically about 2.2 volts when a desired operating current flows through the LEDs in the LED serially connected light string. LEDs are efficient light sources, since the resistance of the LEDs is virtually zero. The voltage drop of a typical LED of about 2.2 volts at a desired operating current of the LED and a frequency of 60 Hz is primarily due to the reactance (X) of the LED. Consequently, if a sufficient number of LEDs are placed in a serial circuit, a sufficient amount of reactance (X) will be present in the circuit to limit the current flowing through the circuit to an operating current that will not cause the LEDs to burn out. Of course, it is desirable to also place a resistor that is serially connected in the light string to limit the amount of in-rush current that may occur, since the reactance (X) of the LEDs is primarily a result of the capacitance of the LEDs and not inductance. Hence, it has been determined that the use of a predetermined number of LEDs, based upon the reactance (X) of the LEDs and the frequency of the power signal, provides a proper operating current for a serially connected light string. As indicated above, a rectifier is not required when using bidirectional diodes. The complex impedance (Z) of the LED is equal to the resistance (R) plus the imaginary portion (jX), which is the imaginary unit j times the reactance (X). If there are less than the optimum number of bidirectional diodes 104-114, a series resistor will be necessary in the light string. However, if there are the optimum number of the bidirectional LEDs 104-114, a series resistor in the light string may not be required, since a full voltage drop can be achieved at a reasonable and proper operating current with the impedance provided by each of the diodes in the bidirectional LEDs utilized in the light string 112. The only exception is that a series resistor may be beneficial to prevent startup current from surging and damaging the LEDs. FIG. 1 also illustrates a socket 116 that can be used to connect the light string 112 to an additional light string. In that case, a power lead (not shown) is needed to supply power to the subsequent light string.

FIG. 2 is a schematic diagram of a bidirectional LED 200. The bidirectional LED 200 has a first LED 202 that is connected in parallel with a second LED 204 that is aligned in an opposite direction. Lens 206 can be a proxy that directs the light outwardly from the LEDs 202, 204. In some higher powered LEDs, various plastics can be used for the lens 206 that function to transmit the light without degradation. Less expensive, lower power LEDs may use epoxy for lens 206. The bidirectional LEDs 200 are connected to leads 208, 210. The leads 208, 210 do not comprise either an anode lead or a cathode lead, since the bidirectional LEDs 200 have anodes connected to cathodes and cathodes connected to anodes. When an AC signal is applied to the bidirectional LEDs, via leads 208, 210, both LEDs 202, 204 will conduct. When the AC signal on lead 208 is positive, LED 202 will conduct. When the AC signal applied to lead 210 is positive, LED 204 will conduct. In other words, when the AC signal on lead 208 is positive, LED 202 will conduct. When the AC signal on lead 208 is negative, LED 204 will conduct. In this manner, at least one of the LEDs 202, 204 is conducting and emitting light during the entire AC signal that is applied to leads 208, 210. Accordingly, the bidirectional LED structure 200 shown in FIG. 2, does not require rectification of the AC signal, which lowers the overall cost of the system that uses bidirectional LEDs 200. Further, the longevity of the system is doubled, since only one of the LEDs 202, 204 is conducting and lit at any given time when an AC signal is applied to leads 208, 210. As such, the lifetime of the bidirectional LEDs 200 and the light string is doubled. LEDs may have a lifetime of 50,000 hours. By doubling the lifetime, a bidirectional LED may have a lifetime of 100,000 hours. Since the lens 206 encapsulates the bidirectional LEDs 200, there is little or no flickering of the light that is emitted by the lens 206, since one of the LEDs 202, 204 is lit and transmitting light virtually the entire time that the AC signal is applied to leads 208, 210.

Figure 3:
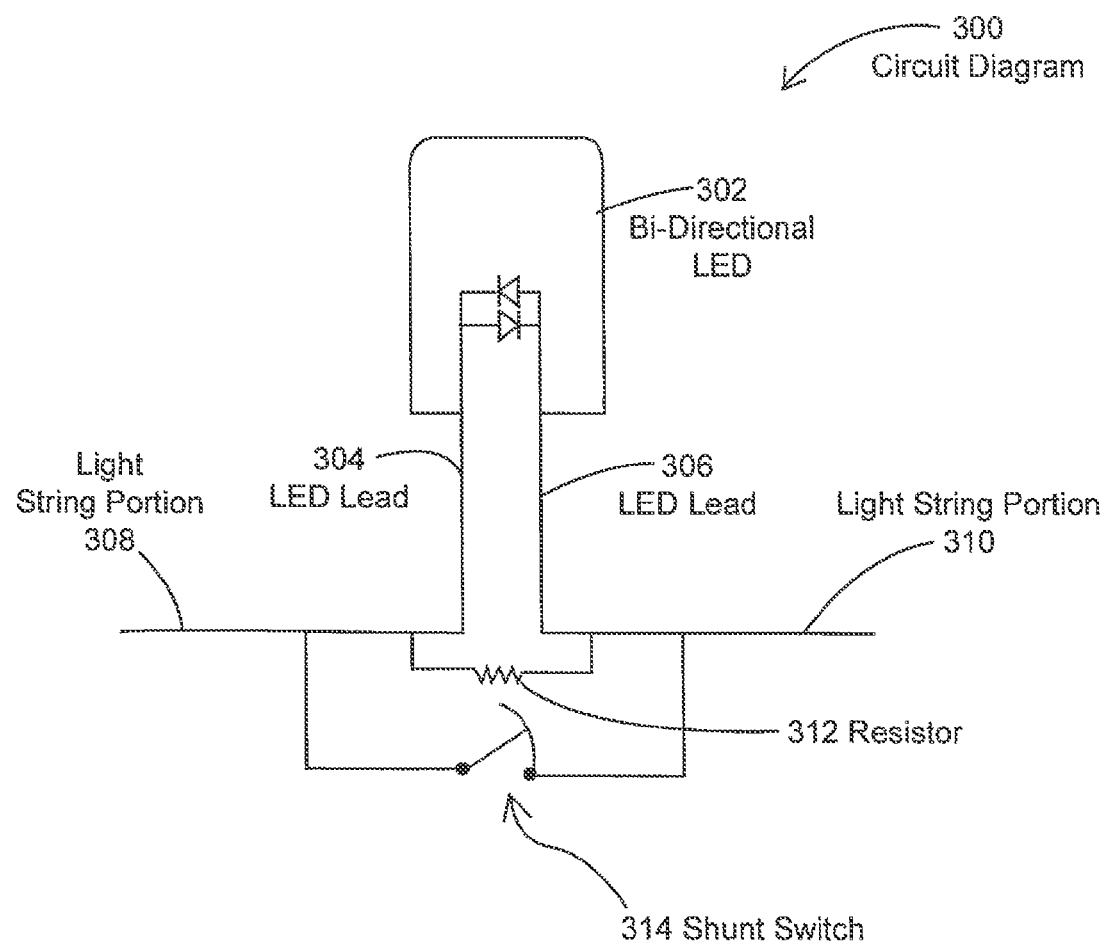
FIG. 3 is a circuit diagram of an embodiment of an implementation of a bidirectional LED in a light string.

FIG. 3 is a circuit diagram 300 of one embodiment of the manner in which a bidirectional LED 302 can be disposed in a light string. The bidirectional LED 302 has LED leads 304, 306 that are connected to the light string. The light string comprises a light string portion 308 and another light string portion 310. Additional LEDs (not shown) are connected in series. The LED is disposed in an LED holder plug, as disclosed in FIGS. 4 and 6, which plugs into a light string socket, as disclosed in FIGS. 5 and 7. The LED holder plug contains a bypass resistor 312 that can be mounted in the LED holder plug, using automated techniques, to connect to the first portion of the light string 308 and the second portion of the light string 310 when the bidirectional LED burns out. In this manner, when the elements of the bidirectional LED 302 burn out, the resistor 312 will continue to conduct electricity from the light string portion 308 to light string portion 310, so that other series connected LEDs will continue to be lit and current will continue to flow through the overall light string. In addition, shunt switch 314 is disposed in a light string socket, as disclosed below, which receives the LED holder plug and provides an open circuit between light string portion 308 and light string portion 310. If the LED holder plug becomes dislodged from the light string socket, the shunt switch 314 closes to provide a current path between light string portion 308 and light string portion 310, so that the light string continues to provide current to other series connected LEDs. In this manner, the circuit 300 of FIG. 3 provides a current path for a light string having serially connected LEDs when either the LEDs burn out or the LED holder plugs become dislodged.

Figure 4:
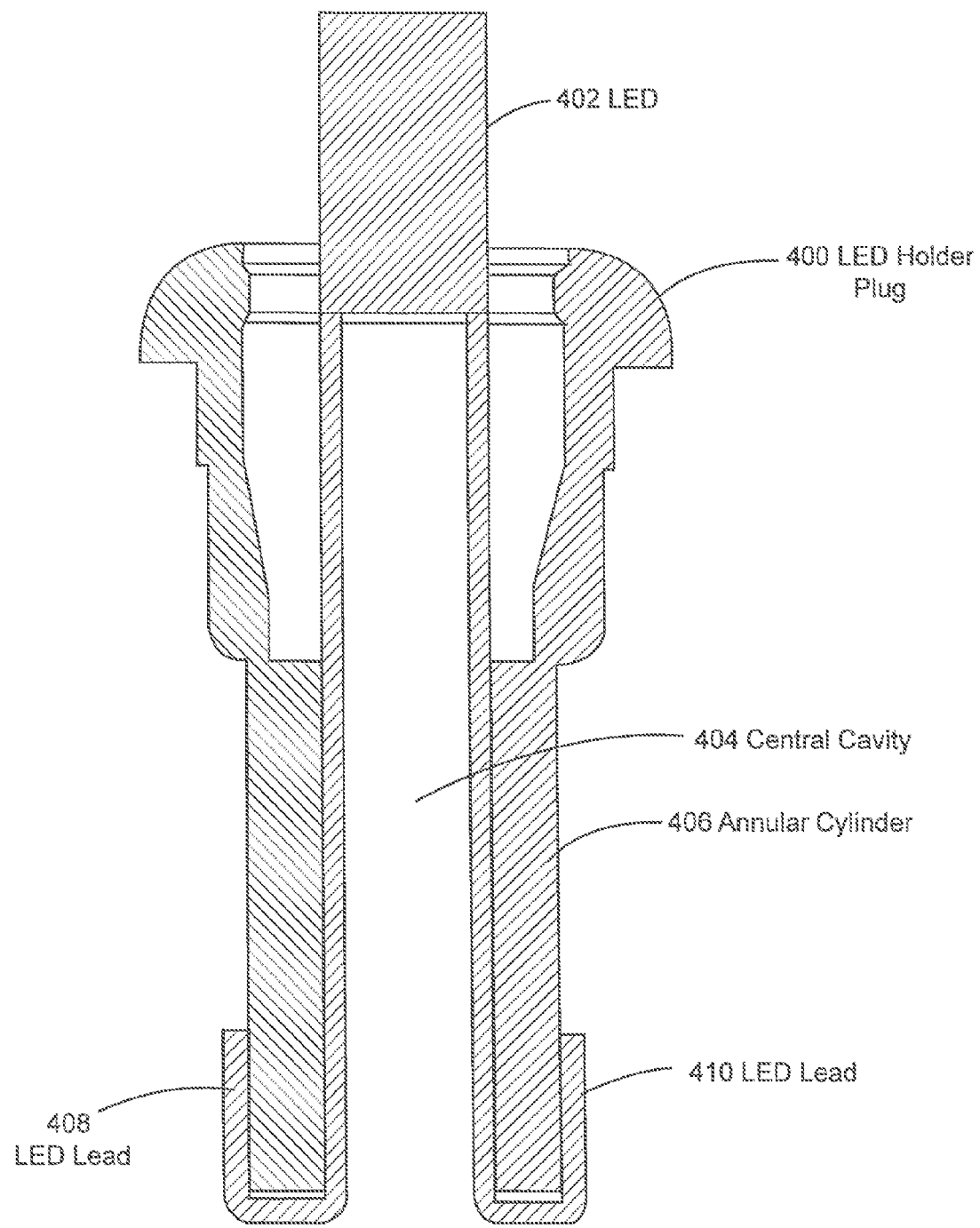
FIG. 4 is a sectional view of an embodiment of an LED holder plug.

FIG. 4 is a cross-sectional view of an embodiment of an LED holder plug 400. As illustrated in FIG. 4, the LED holder plug 400 has an annular cylinder 406 that forms an open central cavity 404. As shown in FIG. 4, the central cavity 404 provides an opening that extends throughout the central portion of the LED holder plug 400. However, in an alternative embodiment, a lower portion of the annular cylinder 406 may be solid, with the exception of openings for LED lead 408 and LED lead 410. As shown in the embodiment of FIG. 4, the LED 402 has two leads, LED lead 408 and LED lead 410. The LED leads 408, 410 extend through the central cavity 404 and are wrapped around the annular cylinder 406, so that the LED leads 408, 410 are exposed on the outer surface of the annular cylinder 406. In this manner, when the LED holder plug 400 is inserted into the light string socket, the LED leads 408, 410 will electrically connect to contacts in the light string holder, as disclosed below. Of course, there may be many different shapes for the LED holder plug 400. The LED holder plug 400 is designed to allow LED 402 to be automatically inserted in the LED holder plug 400. In addition, the LED holder plug 400 may also be constructed to allow a resistor to be automatically inserted also, as disclosed in more detail below.

Figure 5:
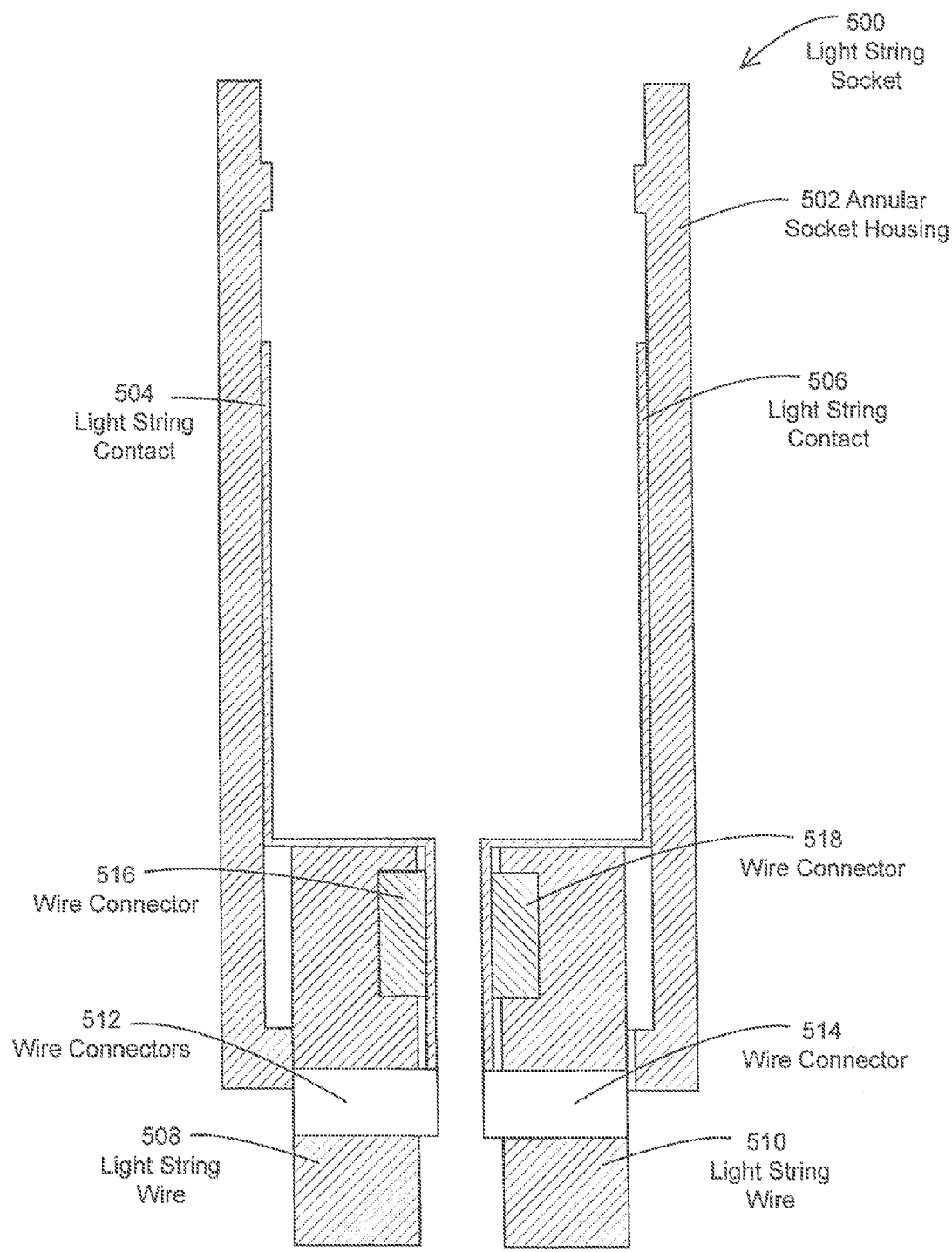
FIG. 5 is an embodiment of a light string socket.

FIG. 5 is a sectional view of a light string socket 500. As illustrated in FIG. 5, the light string socket 500 has an annular socket housing 502. Disposed on the inner surface of the annular socket housing 502 is light string contact 504 and light string contact 506. Light string contacts 504, 506 are metal contacts that contact the LED leads when the LED holder plug is inserted in the top opening of the light string socket 500. Light string contact 504 is connected to the wire connector 516 and wire connector 512. In addition, the light string contact 504 abuts against the light string wire 508, which may correspond to light string portion 308 of FIG. 3. Similarly, light string contact 506 is connected to wire connector 518 and wire connector 514. Wire connector 518 and wire connector 514 are electrically connected to the light string wire 510 that may correspond to light string portion 310 of FIG. 3. Additionally, light string wire 510 abuts against the light string contact 506 to provide a further electrical connection.

The light string socket 500 of FIG. 5 is adapted to receive the LED holder plug 400 and LED 402 illustrated in FIG. 4. When assembled, the LED leads 408, 410 contact the light string contacts 504, 506, respectively, to complete a circuit from the light string wire 508 to the light string wire 510.

Figure 6:
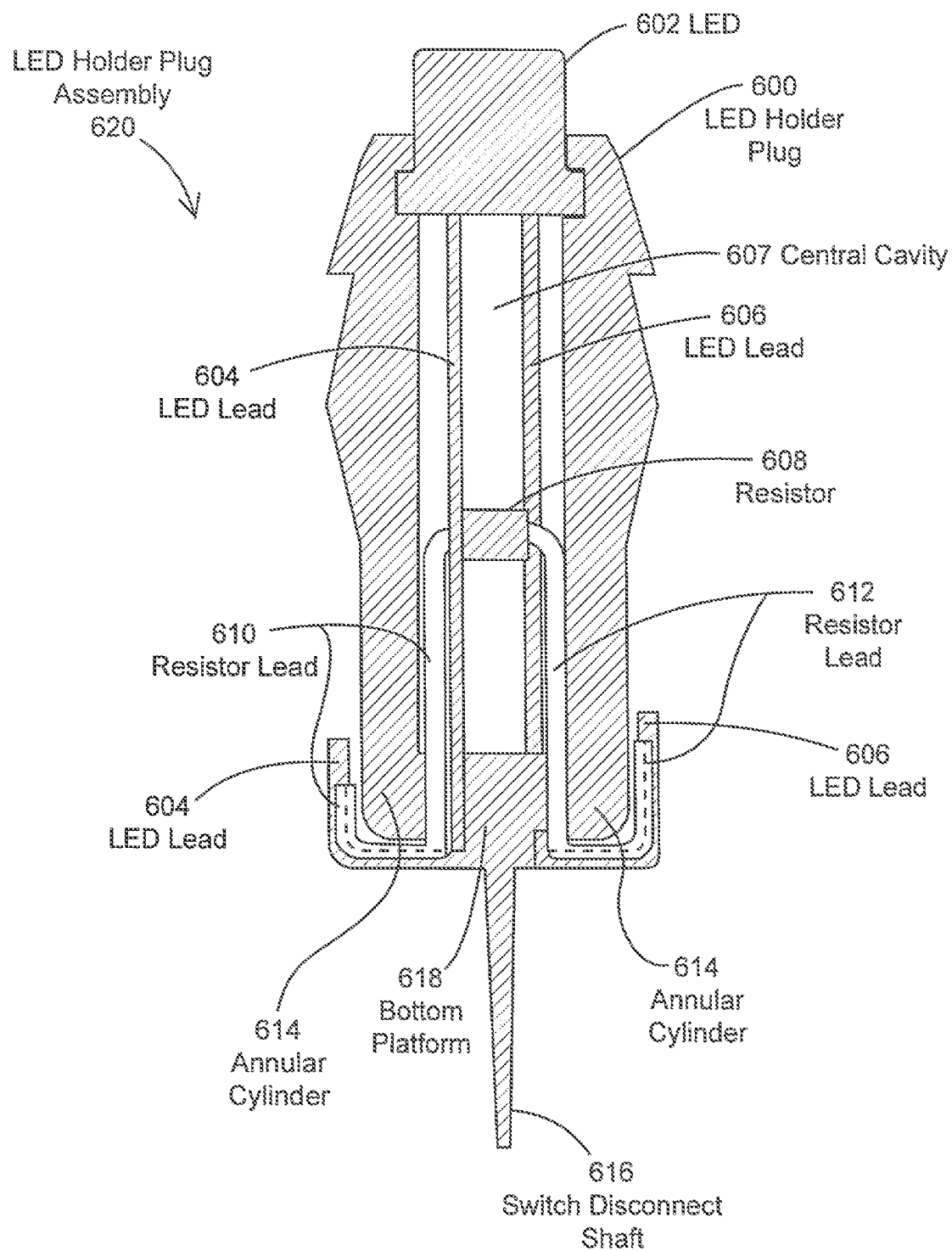
FIG. 6 is an embodiment of an LED holder plug having a shunt resistor disposed in the LED holder plug.

FIG. 6 is another embodiment of an LED holder plug 600. As shown in FIG. 6, the LED holder plug 600 holds an LED 602. The LED 602 has an LED lead 604 and an LED lead 606. The LED holder plug 600 has a central cavity 607 that extends from the opening for the LED 602 to a bottom platform 618. Bottom platform 618 has openings for the LED leads 604, 606 and for the resistor leads 610, 612. Both the resistor 608 and the LED 602 can be inserted through the central cavity 607 and the openings in the bottom platform 618 in an automated fashion using a robotic arm or other well-known automated inserter devices, which greatly reduces the overall cost of the LED holder plug assembly 620. Once the LED leads 604, 606 and the resistor leads 610, 612 are inserted through the openings in the bottom platform 618, the leads are folded around the bottom and the outside of the annular cylinder 614. This process can also be performed in an automated fashion. In this manner, the resistor leads 610, 612 and the LED leads 604, 606 are electrically connected to contacts on the interior portion of a light string socket, such as light string socket 700, illustrated in FIG. 7. The bottom platform 618 has a switch disconnect shaft 616 that interacts with a shunt switch on a light string socket, as disclosed in more detail with respect to FIG. 7.

Figure 7:
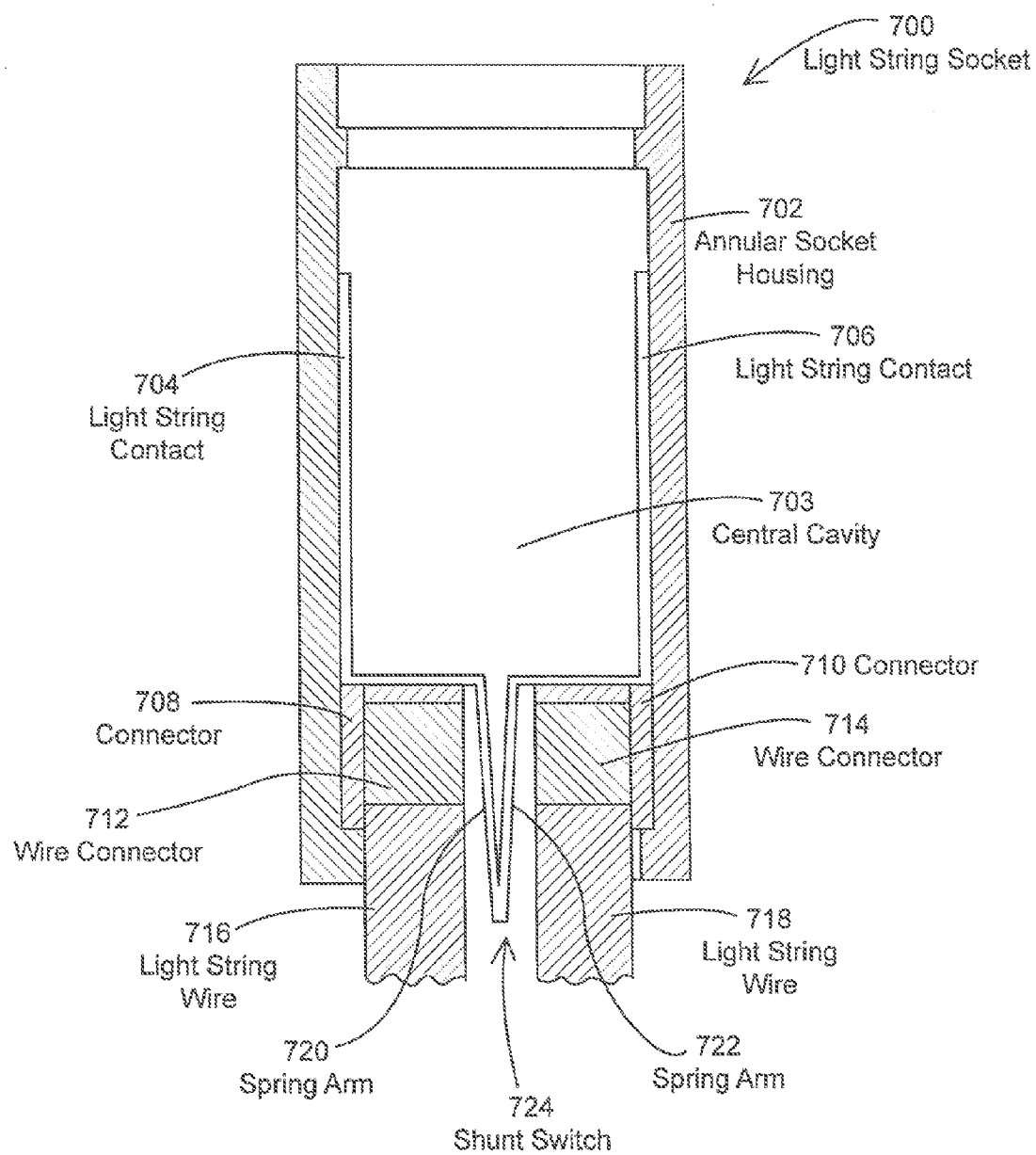
FIG. 7 is a sectional view of an embodiment of a light string socket.

FIG. 7 is a sectional view of a light string socket 700 that is compatible with the LED holder plug 600 of FIG. 6. The light string socket 700 has an annular socket housing 702 that forms a central cavity 703. Light string contacts 704, 706 are attached to the inner surface of the annular socket housing 702. The light string contacts 704, 706 extend along a portion of the length of the central cavity 703. The light string contacts 704, 706 are connected to spring arms 720, 722 that extend downwardly through the central opening in the annular socket housing 702. The spring arms 720, 722 are biased together to create a contact between the light string contact 704 and light string contact 706. Light string wire 716 and light string wire 718 are electrically connected to light string contact 704 and light string contact 706, respectively. Connector 708 is attached to the annular socket housing 702 and to the wire connector 712. Similarly, connector 710 is connected to the annular socket housing 702 and the wire connector 714. Wire connector 712 holds the light string wire 716 tightly within the annular socket housing 702. Similarly, wire connector 714 holds the light string wire 718 firmly within the annular socket housing 702. Wire connectors 712, 714 are typically metal wire connectors that provide a good electrical connection to light string contacts 704, 706, respectively. The shunt switch 724, which is formed from the spring arm 720 and spring arm 722, provides a switch that can electrically connect the light string contact 704 and the light string contact 706. Of course, any desired type of mechanical contact can be used to connect and disconnect an electrical bypass between light string wires 716, 718 when LED holder plug 600 is not present in light string socket 700.

Figure 8:
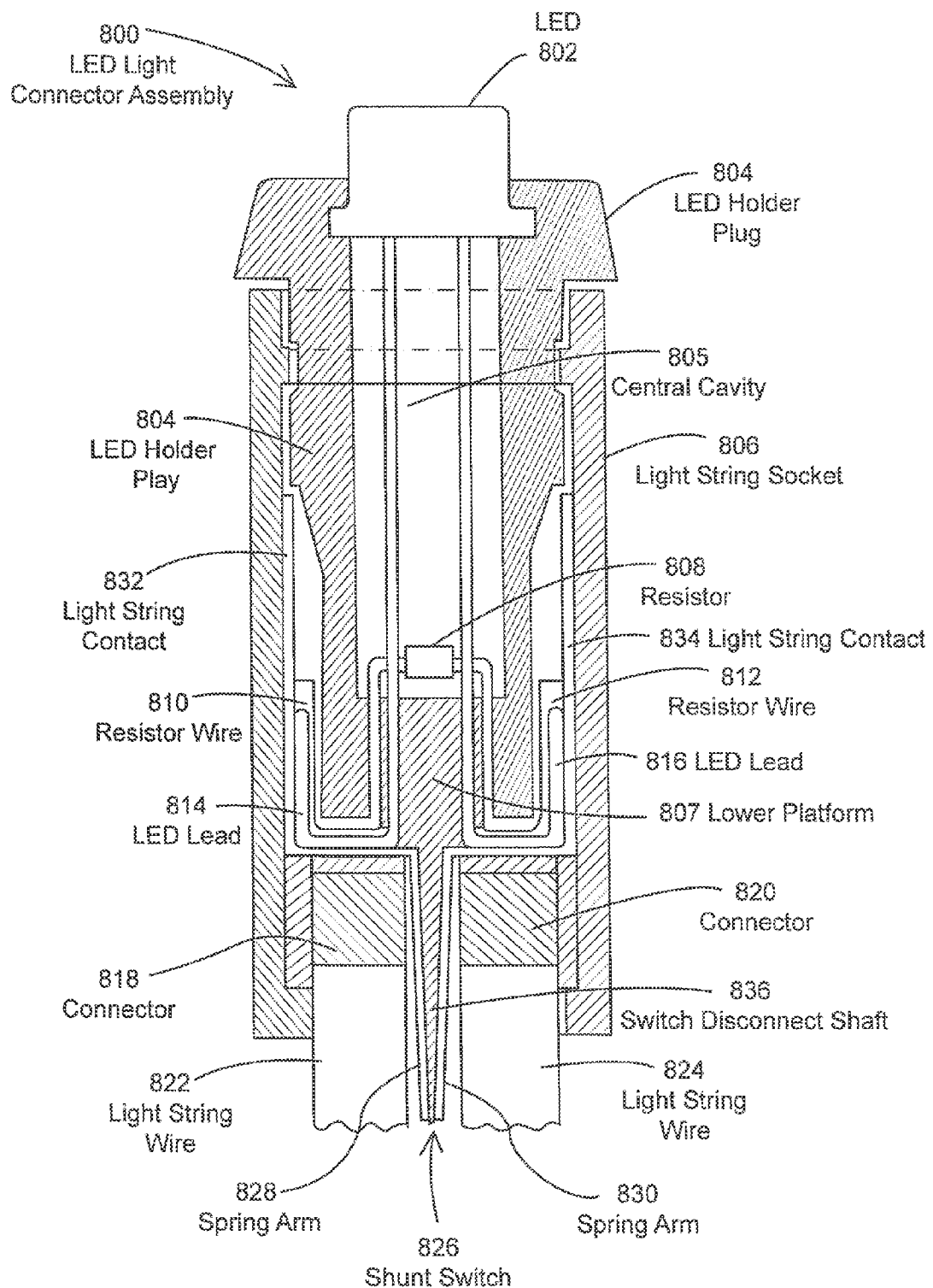
FIG. 8 is a sectional view of an embodiment of an LED light connector assembly.

FIG. 8 is a cross-sectional view of an embodiment of an LED light assembly 800. The LED light assembly 800 comprises an LED 802, an LED holder plug 804, and a light string socket 806. The LED holder plug 804 is similar to the LED holder plug 600 of FIG. 6. Likewise, the light string socket 806 is similar to light string socket 700 of FIG. 7. As illustrated in FIG. 8, the LED holder plug 804 includes a central cavity 805. At the bottom of the central cavity 805 is a lower platform 807. Openings are formed in the lower platform 807 so that the resistor wires 810, 812 of resistor 808 can be automatically inserted through the bottom portion of the LED holder plug 804 and wrapped around the outer surface of the lower end of the LED holder plug 804. Similarly, the LED leads 814, 816 of LED 802 can be automatically inserted through openings in the lower platform 807 and wrapped around the outer surface of the LED holder plug 804, so that the LED leads 814, 816 contact the light string contacts 832, 834, respectively. In this manner, both the resistor wire 810 and LED lead 814 have an electrical connection with light string contact 832. Similarly, resistor wire 812 and LED lead 816 electrically connect to the light string contact 834. Connector 818 is a metal connector that secures the light string wire 822 and connects the light string wire 822 to the light string contact 832. Similarly, connector 820 is a metal connector that firmly holds the light string wire 824 and provides a connection between the light string contact 834 and light string wire 824. As such, a circuit is completed between light string wire 822 and light string wire 824 through the resistor 808 and the LED 802 via light string contacts 832, 834, when the LED holder plug 804 is inserted into the light string socket 806.

As also illustrated in FIG. 8, a shunt switch 826 is present and provides a connection between light string contact 832 and light string contact 834 when the LED holder plug 804 is dislodged from light string socket 806. As illustrated in FIG. 8, both the resistor 808 and the LED 802 provide a circuit path from the light string wire 822 to the light string wire 824, as explained above. If the LED 802 burns out, and creates an open circuit, the resistor 808 provides an alternative current path from the light string wire 822 to the light string wire 824. In this manner, other series wired LEDs will not be disconnected from the series circuit. However, if the LED holder plug 804 becomes dislodged from the light string socket 806, resistor 808 will also become disconnected and will not function to complete the circuit from light string wire 822 to light string wire 824. Shunt switch 826 functions to complete the circuit between the light string wire 822 and the light string wire 824 when the LED holder plug 804 becomes dislodged from the light string socket 806. As illustrated in FIG. 8, the switch disconnect shaft 836 extends between the spring arm 828 and spring arm 830 and causes the spring arms 828, 830 to separate when the LED holder plug 804 is firmly inserted into the light string socket 806. When the LED holder plug 804 is not firmly and fully inserted in the light string socket, the spring arms 720, 722, as illustrated in FIG. 7, connect with each other to provide a connection between the light string wire 716 and light string wire 718, as shown in FIG. 7. By causing the shunt switch 826 of FIG. 8 to be open by separating the spring arms 828, 830 with the switch disconnect shaft 836, the current is forced to flow through the LED 802 and/or resistor 808. As such, the shunt switch 826 provides a current path to other series connected LED lights on the light string when the LED holder plug 804 is not firmly and fully inserted within the light string socket 806.

Of course, any type of mechanical contact switch could be used to complete the connection between light string wire 822 and light string wire 824. For example, a simple contact switch at the bottom of the LED holder plug 804 could be used to open the contact between the light string wire 822 and light string wire 824 when the LED holder plug 804 is inserted into the light string socket 806. Such a contact switch could be activated by the lower platform 807 in any desired manner.

Figure 9:
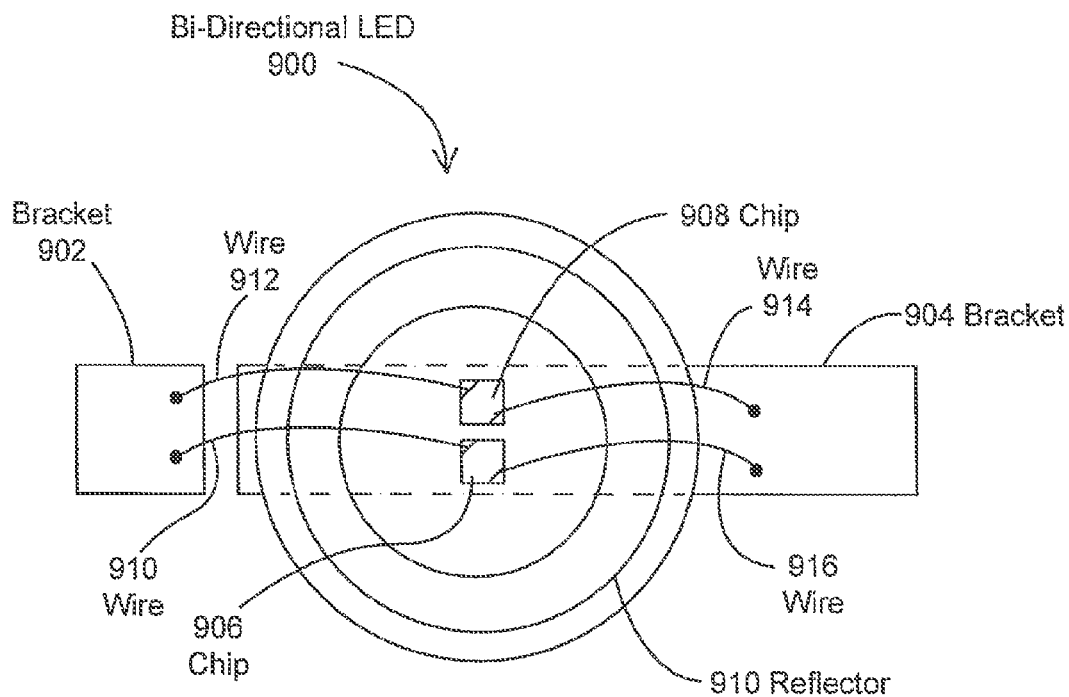
FIG. 9 is a schematic top view of an embodiment of a bidirectional LED.

FIG. 9 is a schematic top view of a bidirectional LED 900. As illustrated in FIG. 9, brackets 902, 904 are conductive devices that are connected to the leads of the bidirectional LED 900. A reflector 918 is mounted on the bracket 904. Semiconductor chips 906, 908 are mounted inside the reflector 918 in opposite directions. Wire 914 connects the anode of chip 908 to bracket 904 while wire 916 connects the cathode of chip 906 to bracket 904. Wire 912 connects the cathode of chip 908 to bracket 902. Wire 910 connects the anode of chip 906 to bracket 902. In this manner, the chips 906, 908 are wired in parallel in opposite directions and connected to the brackets 902, 904.

Figure 10:
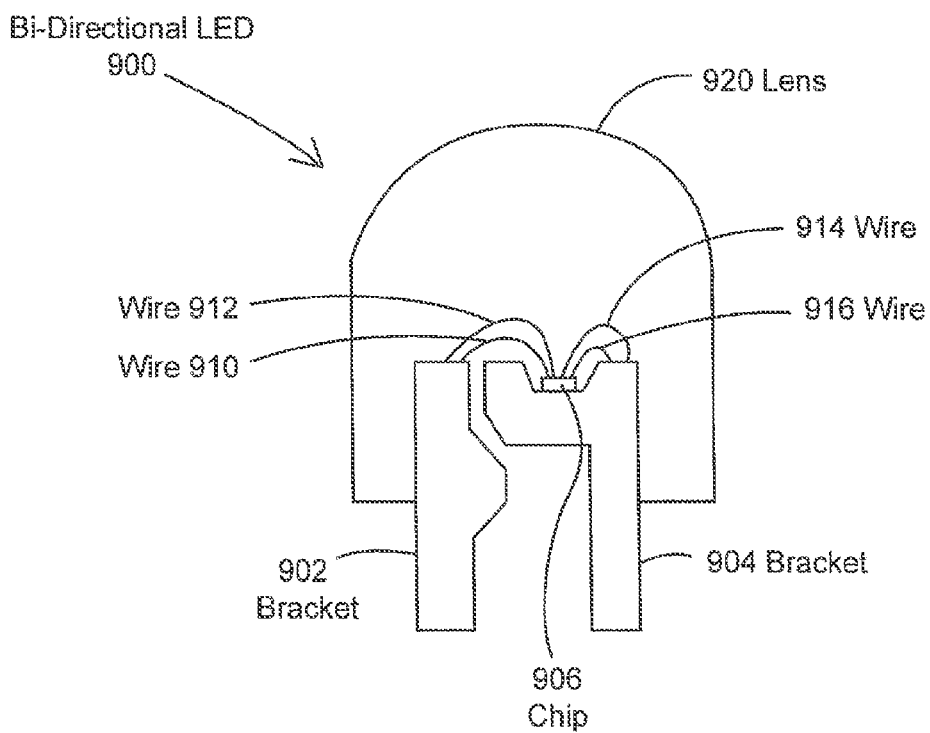
FIG. 10 is a side view of an embodiment of a bidirectional LED.

FIG. 10 is a side view of the bidirectional LED 900. As illustrated in FIG. 10, brackets 902, 904 protrude from the lower portion of the lens 920. The chip 906 is illustrated in the side view of FIG. 10. Chip 908 is not illustrated, since chip 908 is blocked by chip 906 in the side view of FIG. 10. Wires 910, 912, 914, 916 attach the chips 906, 908 (not shown) to the brackets 902, 904. In this manner, bidirectional LEDs can be placed in a single bidirectional LED 900 within the bracket 904 to create a bidirectional LED within a single lens 920.

Hence, embodiments are disclosed that allow LEDs to be inserted in an LED holder plug in an automated fashion, as well as resistors, which reduces the cost of assembly of an LED light string, such as the light string 100 that uses bidirectional LEDs. In this manner, a bypass component, such as a resistor, can be connected in parallel with an LED so that current can continue to flow in a serially connected light string if an LED burns out. Further, a shunt switch can be utilized, which provides an alternative current path around an LED light assembly if the LED holder plug becomes dislodged or is not firmly seated within the light string socket. As such, the current path is established between the light string wires in each LED light assembly, so that additional light assemblies that are connected in series will maintain power. When bidirectional LEDs are utilized, a rectifier is not required, since the bidirectional LED will be lit during both positive and negative cycles of an AC signal. Further, when a sufficient number of LEDs are placed in series in the line, an adequate amount of impedance can be generated, so that an additional impedance element is not required. However, if the LED holder plug becomes dislodged in the light string socket, a shunt switch or contact switch may be activated that eliminates the impedance for that particular LED light assembly. In that case, resistive elements should be included within the series light string to prevent an overcurrent situation in the light string.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A serial light emitting diode light string that does not use a rectifier comprising:
    a plurality of bidirectional light emitting diodes, each of said plurality of bidirectional light emitting diodes comprising:
        a first light emitting diode mounted on a first wafer that is encapsulated by a lens, said first light emitting diode having an anode and a cathode;
        a second light emitting diode mounted on a second wafer that is encapsulated by said lens, said second light emitting diode having an anode that is electrically connected to said cathode of said first light emitting diode to form a first node and a cathode that is electrically connected to said anode of said first light emitting diode to form a second node;
    a serial string of said plurality of bidirectional light emitting diodes formed by connecting said first nodes of each bidirectional light emitting diode of said plurality of bidirectional light emitting diodes to said second nodes of an adjacent bidirectional light emitting diode of said plurality of bidirectional light emitting diodes to create said serial light emitting diode light string;
    a bypass resistor connected between said first node and said second node of each bidirectional light emitting diode of said plurality of bidirectional light emitting diodes which provides an alternative current path around each bidirectional light emitting diode of said plurality of bidirectional light emitting diodes;
    a shunt switch connected between said first node and said second node of each bidirectional light emitting diode of said plurality of bidirectional light emitting diodes, said shunt switch disposed in a light string socket so that when a bidirectional light emitting diode is disconnected from said light string socket, said shunt switch creates a shunt around said light string socket which provides an alternative current path around said light string socket for each bidirectional light emitting diode that becomes disconnected from said light string socket;

an alternating current connector attached to said serial light emitting diode light string, said alternating current connector providing alternating current to said serial string of bidirectional light emitting diodes, without a rectifier, which causes said first light emitting diode to be illuminated while said alternating current is positive, and which causes said second light emitting diode to be illuminated while said alternating current is negative, so that said bidirectional light emitting diodes do not flicker and have an extended life, since each of said first light emitting diode and said second light emitting diode is illuminated for a half of a cycle of said alternating current.

2. The serial light emitting diode light string of claim 1 further comprising:
a resistive element disposed in said serial string of bidirectional light emitting diodes that limits current flow.

3. A method of making a serial string of bidirectional light emitting diodes that does not use a rectifier comprising:
providing a plurality of bidirectional light emitting diodes, each of said plurality of bidirectional light emitting diodes comprising:
a first light emitting diode mounted on a first wafer that is encapsulated by a lens, said first light emitting diode having an anode and a cathode;
a second light emitting diode mounted on a second wafer that is encapsulated by said lens, said second light emitting diode having an anode that is electrically connected to said cathode of said first light emitting diode to form a first node and a cathode that is electrically connected to said anode of said first light emitting diode to form a second node;

connecting said plurality of bidirectional light emitting diodes so that said first nodes of each bidirectional light emitting diode are connected to said second nodes of adjacent bidirectional light emitting diodes to form said serial string of bidirectional light emitting diodes;

connecting a bypass resistor between said first node and said second node of each bidirectional light emitting diode of said serial string of bidirectional light emitting diodes which provides an alternative current path around each bidirectional light emitting diode of said serial string of bidirectional light emitting diodes;

connecting a shunt switch between said first node and said second node of each light emitting diode of said plurality of bidirectional light emitting diodes, said shunt switch disposed in a light string socket so that when a bidirectional light emitting diode is disconnected from said light string socket, said shunt switch creates a shunt around said light string socket which provides an alternative current path around each light string socket for each bidirectional light emitting diode that becomes disconnected from said light string socket;

applying an alternating current to said serial string of bidirectional light emitting diodes without rectifying said alternating current which causes said first light emitting diode to illuminate when said alternating current is positive, and causes said second light emitting diode to illuminate when said alternating current is negative, so that said bidirectional light emitting diodes do not flicker and have an extended life since each of said first light emitting diode and said second light emitting diode are illuminated for a half cycle of said alternating current.

4. The method of claim 3 further comprising:
connecting a resistive element in said serial string of bidirectional light emitting diodes to limit current flow.

* * * * *